(12) United States Patent
Eberlein

(10) Patent No.: US 9,816,871 B2
(45) Date of Patent: Nov. 14, 2017

(54) THERMAL SENSOR INCLUDING PULSE-WIDTH MODULATION OUTPUT

(71) Applicant: Intel Corporation, Santa Clara, CA (US)

(72) Inventor: Matthias Eberlein, Holzkirchen (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/865,490

(22) Filed: Sep. 25, 2015

(65) Prior Publication Data
US 2017/0089765 A1    Mar. 30, 2017

(51) Int. Cl.
| H01L 23/58 | (2006.01) |
| H01L 29/10 | (2006.01) |
| G01K 7/01 | (2006.01) |
| H01L 23/34 | (2006.01) |
| H01L 27/02 | (2006.01) |
| H01L 27/06 | (2006.01) |
| H01L 49/02 | (2006.01) |
| H01L 29/78 | (2006.01) |
| H01L 29/861 | (2006.01) |

(52) U.S. Cl.
CPC ............... *G01K 7/01* (2013.01); *H01L 23/34* (2013.01); *H01L 27/0222* (2013.01); *H01L 27/0629* (2013.01); *H01L 28/60* (2013.01); *H01L 29/785* (2013.01); *H01L 29/861* (2013.01)

(58) Field of Classification Search
CPC ... G01K 7/01; H01L 27/0222; H01L 27/0629; H01L 29/785; H01L 29/861; H01L 23/34; H01L 28/60
See application file for complete search history.

(56) References Cited

U.S. PATENT DOCUMENTS

| 2013/0051427 A1* | 2/2013 | Wang | G01K 7/01 374/152 |
| 2014/0023110 A1* | 1/2014 | Hamanaka | G01K 13/00 374/142 |
| 2014/0086279 A1* | 3/2014 | Cao | G01K 7/01 374/183 |

OTHER PUBLICATIONS

Heidary, Ali, et al., "A BJT-Based CMOS Temperature Sensor with a 3.6pJ•K2-Resolution FoM", ISSCC 2014 / Session 12 / Sensors, MEMS, and Displays / 12.8, (Feb. 11, 2014), 3 pgs.

* cited by examiner

*Primary Examiner* — Jesse Y Miyoshi
(74) *Attorney, Agent, or Firm* — Schwegman Lundberg & Woessner, P.A.

(57) ABSTRACT

Some embodiments include apparatuses and methods having a node to receive ground potential, a first diode including an anode coupled to the node, a second diode including an anode coupled to the node, a first circuit to apply a voltage to a cathode of each of the first and second diodes to cause the first and second diodes to be in a forward-bias condition, and a second circuit to generate a signal having a duty cycle based on a first voltage across the first diode and a second voltage across the second diode. At least one of such the embodiments includes a temperature calculator to calculate a value of temperature based at least in part on the duty cycle of the signal.

21 Claims, 5 Drawing Sheets

303

303'

THERMAL SENSOR INCLUDING PULSE-WIDTH MODULATION OUTPUT

TECHNICAL FIELD

Embodiments described herein pertain to thermal management electronic systems. Some embodiments relate to thermal sensors.

BACKGROUND

Many electronic devices or systems, such as computers, network devices, tablets, and cellular phones, have thermal sensors to monitor the temperature of the device or system. For precise measurements of temperature, conventional thermal sensors in such devices or systems usually rely on parasitic PNP components (e.g., parasitic PNP bipolar transistors). However, in some fabrication technologies, the quality of such PNP components may degrade drastically due to factors such as micro-defects in junctions (e.g., emitter-base junction) in the PNP components. Further, some conventional thermal sensors may need multi-point trim for sensing adjustment in order to meet specific measurement accuracy. Moreover, in some fabrication processes, options for forming such PNP components in the device may be limited or may be non-existent. Thus, for the at least reasons mentioned herein, designing thermal sensors in some conventional devices may pose a challenge.

DETAILED DESCRIPTION

Figure 1:
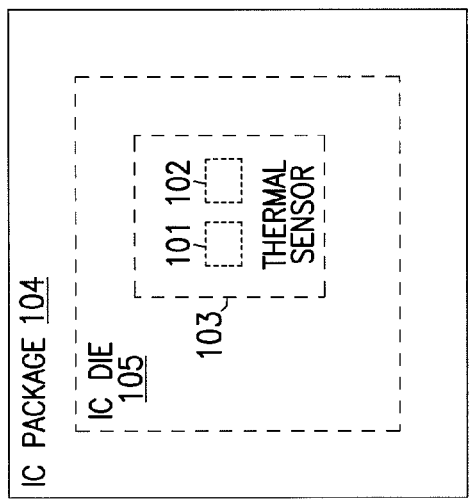
FIG. 1 shows an apparatus including a thermal sensor, according to some embodiments described herein.

FIG. 1 shows an apparatus 100 including a thermal sensor 103, according to some embodiments described herein. Apparatus 100 can include or be included in an electronic device or system, such as a computer (e.g., desktop, laptop, or notebook), a tablet, a cellular phone, wearable electronics (e.g., smart watches), or other electronic devices or systems.

As shown in FIG. 1, apparatus 100 can include an IC package 104 that can include an IC die (e.g., chip) 105. IC die 105 can include a semiconductor IC die (e.g., a silicon IC die). Thermal sensor 103 can be included in (e.g., formed in or formed on) IC die 105. Apparatus 100 can include or be included in a system on chip (SoC), such that thermal sensor 103 can be included (e.g., integrated) in the SoC. To help focus on the embodiments described herein, elements shown in FIG. 1 are not scaled.

As shown in FIG. 1, thermal sensor 103 can include thermal sensing elements 101 and 102 that can operate to sense temperature (e.g., operating temperature) of a device or system included in apparatus 100. Each of thermal sensing elements 101 and 102 can include a semiconductor element (e.g., a diode). Thermal sensor 103 can also include additional components (not shown in FIG. 1) such as capacitors, transistors, and other components. Such additional components of thermal sensor 103 can operate in combination with thermal sensing elements 101 and 102 to calculate the value of temperature sensed by thermal sensing elements 101 and 102. Based on the calculated value of temperature, apparatus 100 may perform appropriate actions in order to maintain its operations.

FIG. 1 shows an example where apparatus 100 includes only two thermal sensing elements 101 and 102 within proximity of each other to allow apparatus 100 to perform thermal sensing (e.g., single spot sensing) at the location where two thermal sensing elements 101 and 102 are located. However, apparatus 100 may include more than two thermal sensing elements that can be located at different locations in apparatus 100 to allow it to perform thermal sensing at multiple locations (e.g., multi-spot sensing).

Figure 2:
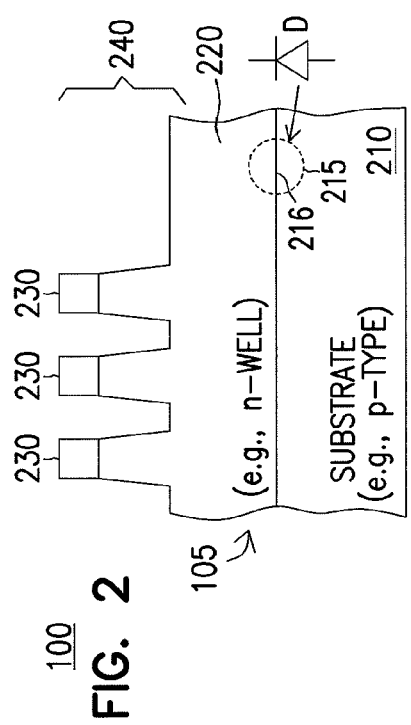
FIG. 2 shows a cross-section of part of the apparatus of FIG. 1 including a cross-section of part of an integrated circuit (IC) die of the apparatus, according to some embodiments described herein.

FIG. 2 shows a cross-section of part of apparatus 100 including a cross-section of part of IC die 105 of FIG. 1, according to some embodiments described herein. As shown in FIG. 2, IC die 105 can include a substrate 210, a portion 220 directly contacting substrate 210, and portions 230. Substrate 210 can include p-type material (e.g., p-type silicon). Portion 220 can be part of a well (e.g., n-well) formed in or formed on substrate 210, such that portion 220 and substrate 210 have different types of materials. For example, portion 220 can include n-type material (e.g., n-type silicon). Portions 230 and portion 220 can also have different types of materials that may form part of a transistor structure 240. For example, portions 220 can include p-type material (e.g., p-type silicon material). Thus, substrate 210, portion 220, and portions 230 can have p-type, n-type, and p-type materials, respectively (e.g., p-type silicon, n-type silicon, and p-type silicon, respectively).

Transistor structure 240 can include multi-gate transistors (e.g., multi-gate field-effect transistors (FETs)). Examples of such multi-gate transistors include tri-gate transistors, fin-FETs, and other types of multi-gate transistors.

As shown in FIG. 2, IC die 105 can include a region 215 formed by part of substrate 210 and part of portion 220 (e.g., part of an n-well). Region 215 has a junction 216 where part of substrate 210 directly contacts part of portion 220. Thus, junction 216 can include a p-n junction formed by p-type material of substrate 210 and n-type material of portion 220.

IC die 105 can include a diode D where junction 216 can be the p-n junction of diode D. Diode D can be used as any of thermal sensing elements 101 and 102 of thermal sensor 103 of FIG. 1. For simplicity, only one diode D corresponding to one region 215 is shown in FIG. 2. However, multiple diodes (e.g., similar to diode D) can be formed from multiple regions similar to region 215. For example, substrate 210 can include p-type material and different regions of substrate 210 can be doped with dopants of n-type material to form multiple n-type doped regions in substrate 210. The junctions (e.g., similar to junction 216) between the multiple n-type doped regions and substrate 210 can form multiple p-n junctions that can be part of multiple diodes. In such n-type doped regions, the size in one n-type doped region can be different from the size of another n-type doped region. This allows diodes formed from n-type doped regions in substrate 210 to have different current densities (e.g., different ratio-sized diodes).

Thus, in apparatus 100 shown FIG. 2, multiple (e.g., two) diodes similar to diode D having different current densities (e.g., different sizes) can be formed in substrate 210 by forming different n-doped regions in substrate 210. The multiple diodes can be used as thermal sensing elements 101 and 102 of thermal sensor 103 of FIG. 1.

As described above with reference to FIG. 1 and FIG. 2, each of thermal sensing elements 101 and 102 (FIG. 1) can be formed from a diode in die 105 (FIG. 2) where a junction (e.g., the n-well-to-substrate junction) such as junction 216 (FIG. 2) can be the p-n junction of the diode. Such p-n junction may be less susceptible to be degraded by process scaling, surface defects, or both, and may maintain its relatively high quality. Thus, the n-well-to-substrate junction (e.g., 216 in FIG. 2) may allow it be part of a p-n junction of the diode, which can be included in each of thermal sensing elements 101 and 102 (FIG. 1).

Figure 3:
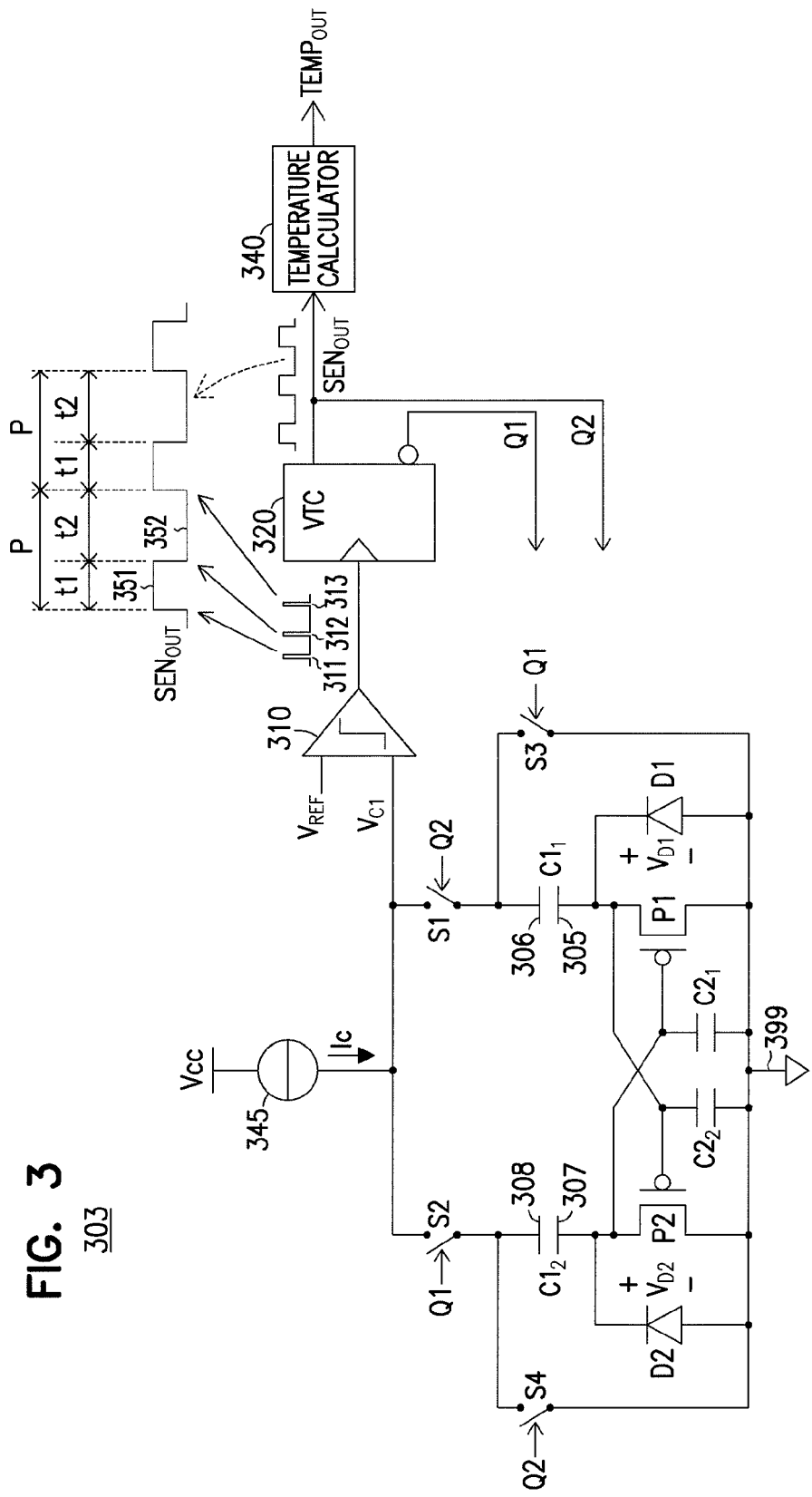
FIG. 3 shows a schematic diagram of a thermal sensor, according to some embodiments described herein.

FIG. 3 shows a schematic diagram of a thermal sensor 303, according to some embodiments described herein. As shown in FIG. 3, thermal sensor 303 can include diodes D1 and D2, capacitors $C1_1$, $C1_2$, $C2_1$, and $C2_2$, switches S1, S2, S3, and S4, transistors P1 and P2, a comparator 310, signal generator 320, and a temperature calculator 340. Thermal sensor 303 can include the structure of thermal sensor 103 of FIG. 1. Thus, at least a portion of thermal sensor 303 can be formed from part of an IC die such as IC die 105 (FIG. 2). For example, each of diodes D1 and D2 can have a structure (n-well-to-substrate junction structure) of diode D in FIG. 2.

As described in more detail below, thermal sensor 303 can operate to generate a negative voltage and apply the negative voltage to diodes D1 and D2 at different times in order to alternately cause diodes D1 and D2 to be in forward-bias condition. Voltage $V_{D1}$ is the voltage (e.g., voltage-drop) across diode D1 when it is in forward-bias condition. Voltage $V_{D2}$ is the voltage (e.g., voltage-drop) across diode D2 when it is in forward-bias condition. Each of voltages $V_{D1}$ and $V_{D2}$ is temperature dependent. Thus, the value of each of voltages $V_{D1}$ and $V_{D2}$ can vary depending temperature. Capacitors $C1_1$ and $C1_2$ and comparator 310 can operate to perform a voltage-to-time conversion to convert the value of each of voltages $V_{D1}$ and $V_{D2}$ into time. Signal generator 320 can operate to generate signal (e.g., temperature sensing output signal) $SEN_{OUT}$. The duty cycle of signal $SEN_{OUT}$ is based on the ratio of the values of voltages $V_{D1}$ and $V_{D2}$. The values of voltages $V_{D1}$ and $V_{D2}$ are based on the sizes of diodes D1 and D2, respectively. Temperature calculator 340 can calculate the value of temperature based at least in part on the duty cycle of signal $SEN_{OUT}$ and generate information $TEMP_{OUT}$ that indicates the calculated value of the temperature.

Diodes D1 and D2 of thermal sensor 303 can be configured (e.g., structured) to have different current densities. For example, diodes D1 and D2 can have different sizes (e.g., different diode size-ratio). In some configurations, diodes D1 and D2 can have a size-ratio N, where N is different from one (e.g., N=2, 8, 20, or other ratio values). The different current densities of diodes D1 and D2 may allow thermal sensor 303 to simplify calculation for the value of temperature (as described in detailed below). Each of diodes D1 and D2 can include a p-n junction having an anode formed from part of a p-type substrate and a cathode formed from part of an n-doped region. For example, the anode of each of diodes D1 and D2 in FIG. 3 can include (e.g., can be formed from) be part of a substrate (e.g., p-type substrate), such as substrate 210 (FIG. 2). The cathode of each of diodes D1 and D2 can include (e.g., can be formed from) part of an n-type doped portion (e.g., part of an n-well) in the substrate, such as portion 220 (FIG. 2).

Capacitors $C1_1$ and $C1_2$ of thermal sensor 303 in FIG. 3 can have the same capacitance (e.g., same size). This may allow thermal sensor 303 to simplify calculation for the value of temperature (as described in detailed below). Transistors P1 and P2 can include a p-channel field effect transistor (e.g., p-channel (PMOS) transistor). Capacitors $C2_1$ and $C2_2$ can have the same capacitance or different capacitances, as long as they can provide appropriate voltage to control (e.g., turn on) the gate transistor P1 while capacitor $C1_1$ is charged and control (e.g., turn on) the gate of transistor P2 while capacitor and $C1_2$ is charged.

Capacitors $C1_1$ and $C1_2$, switches S1, S2, S3, and S4, transistors P1 and P2, and capacitors $C2_1$ and $C2_2$ can operate to form part of a circuit (e.g., a charge pump) to alternately charge capacitors $C1_1$ and $C1_2$ and alternately discharge capacitors $C1_1$ and $C1_2$ in order to generate a negative voltage. The negative voltage is alternately applied to the cathodes (e.g., part of n-doped region) of diodes D1 and D2 while the anodes (e.g., part of a p-type substrate) of diodes D1 and D2 are coupled to ground. Alternately applying the negative voltage causes diodes D1 and D2 to alternately be in forward-bias condition. As mentioned above, temperature-dependent voltage $V_{D1}$ is developed across diode D1 when it is in a forward-bias condition. Voltage $V_{D2}$ is developed across diode D2 when it is in a forward-bias condition. Each of voltages $V_{D1}$ and $V_{D2}$ is temperature dependent. For example, each of voltages $V_{D1}$ and $V_{D2}$ has a lower value when temperature (e.g., operating temperature) increases and a higher value when temperature decreases.

Comparator 310 and signal generator 320 may form part of a circuit to generate signal $SEN_{OUT}$ having a duty cycle based on voltages $V_{D1}$ and $V_{D2}$. For example, comparator 310 can operate to sample the values of voltages $V_{D1}$ and $V_{D2}$. The values of values of voltages $V_{D1}$ and $V_{D2}$ can be based on the charging (e.g., re-charging) time of capacitors $C1_1$ and $C1_2$, respectively. The charging time of each of capacitors $C1_1$ and $C1_2$ is the amount of time it takes for each of capacitor to charge (or recharge) from a particular voltage (e.g., $V_{D1}$ or $V_{D2}$) to a reference voltage (e.g., $V_{REF}$). For example, the charging times of capacitors $C1_1$ and $C1_2$ can be based on the values of voltages $V_{D1}$ and $V_{D2}$, respectively, which are based on the size-ratio of diodes D1 and D2. Thus, although capacitors $C1_1$ and $C1_2$ can have the same capacitance, the charging times of capacitors $C1_1$ and $C1_2$ can be different because the current densities (e.g., size-ratio) of diodes D1 and D2 are different.

Signal $SEN_{OUT}$ is a pulse-width modulated (PWM) signal having a period P. The value of period P is based on the values of time intervals (e.g., phases) t1 and t2. The values of time intervals t1 and t2 can be based on the charging (e.g., re-charging) times of capacitors $C1_1$ and $C1_2$, respectively. Thus, the duty cycle (dc) of signal $SEN_{OUT}$ can be based on the charging times of capacitors $C1_1$ and $C1_2$, respectively.

Temperature calculator 340 of thermal sensor 303 can operate to calculate the value for temperature based on information (e.g., duty cycle) contained in signal $SEN_{OUT}$.

Temperature calculator 340 may generate information TEMP$_{OUT}$ that indicates the calculated value of the temperature.

As shown in FIG. 3, switches S1, S2, S3, and S4 can be controlled by signals Q2 and Q1. Each of switches S1, S2, S3, and S4 can be controlled (e.g., turned on or turned off) to be in a closed state (e.g., a turn-on state or "ON") and in an open state (e.g., a turn-off state or "OFF"). The alternate charging of capacitors C1$_1$ and C1$_2$ and the alternate discharging of capacitors C1$_1$ and C1$_2$, as mentioned above, can be performed by controlling the states (ON and OFF) of switches S1, S2, S3, and S4. For example, to charge capacitor C1$_1$ (while capacitor C1$_2$ is discharged), the states of the switches can be as follows: switch S1=ON, switch S2=OFF, S3=OFF, and switch S4=ON. To charge capacitor C1$_2$ (while capacitor C1$_1$ is discharged), the states of the switches can be as follows: switch S2=ON, switch S1=OFF, switch S3=ON, and S4=OFF.

Signal Q2 can be the same as signal SEN$_{OUT}$. Signal Q1 can have an opposite phase and be non-overlapping with signal Q2 (e.g., signal Q1 and Q2 are non-overlapping signals). The non-overlapping of signals Q1 and Q2 prevents switches S1 and S2 from having the same state (e.g., prevents both switches S1 and S2 from being ON at the same time or from being OFF at the same time). This may prevent errors during transitions between charging of capacitors C1$_1$ and C1$_2$.

Generating a negative voltage in thermal sensor 303 and applying the negative voltage to alternately forward bias diodes D1 and D2 can include the following operations. A current Ic from a current source 345 (associated with a voltage (e.g., supply voltage Vcc)) may provide the same amount of current to charge plate 306 of capacitor C1$_1$ and plate 308 of capacitor C1$_2$ at different times. In a charging stage of capacitor C1$_1$ (e.g., while capacitor C1$_2$ is discharged), a bottom plate 305 of capacitor C1$_1$ is coupled to ground (e.g., at node 399 in FIG. 3) through transistor P1 (which is turned on) while a top plate 306 of capacitor C1$_1$ is charged (e.g., linearly charged) with current Ic. Then, top plate 306 of capacitor C1$_1$ 306 is coupled to ground (through switch S4). This causes bottom plate 305 of capacitor C1$_1$ to have a negative voltage. The negative voltage from bottom plate 305 of capacitor C1$_1$ is applied to the cathode of diode D1, causing diode D1 to be in forward-bias condition. This biases a current (e.g., Iii not shown in FIG. 3) to diode D1 and causes capacitor C1$_1$ to quickly discharge toward ground through diode D1 (which is in forward-bias condition). Capacitor C1$_1$ may stop discharging when the voltage at its bottom plate 305 reaches a value of a voltage (e.g., $-V_{D1}$) that causes diode D1 to be out of forward-bias condition. The description herein assumes that the serial resistance R associated with diode D1 is negligible.

Figure 4A:
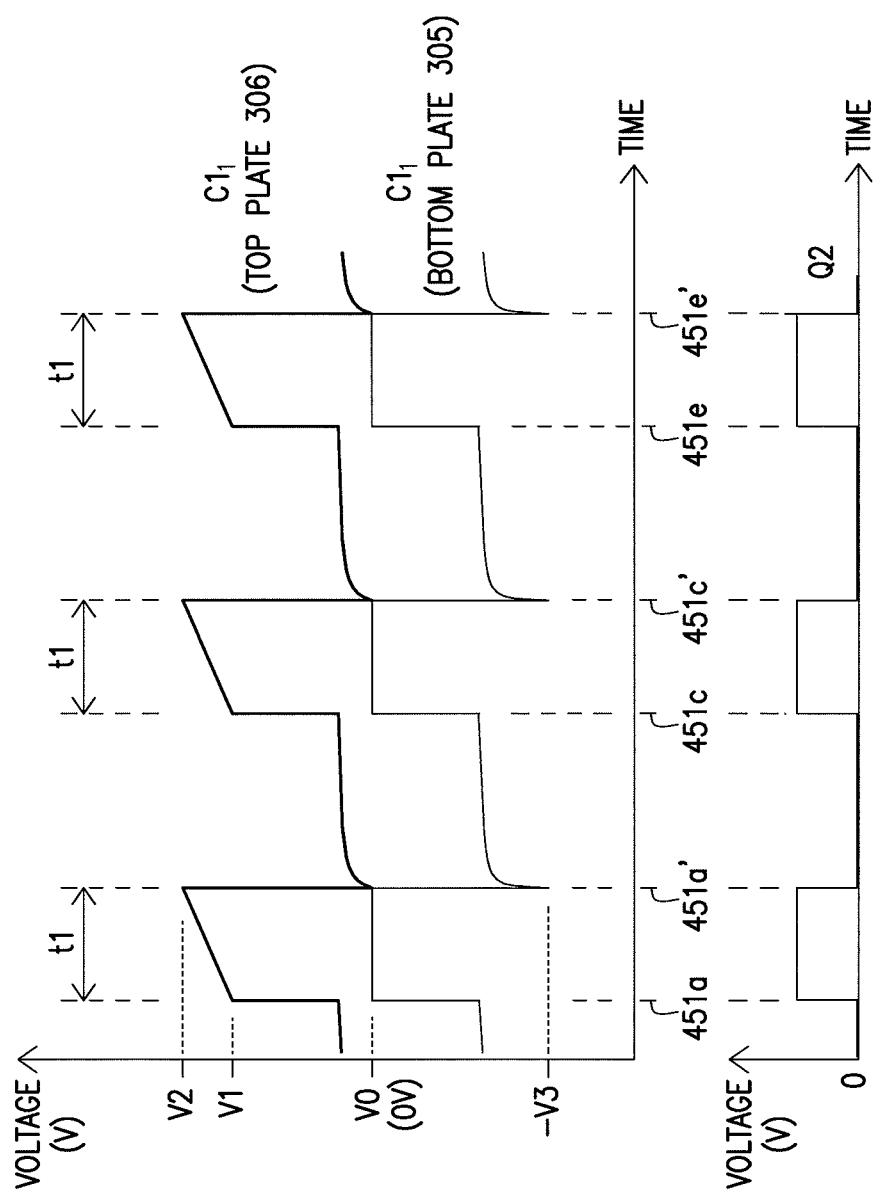
FIG. 4A shows waveforms of voltages on top and bottom plates of a capacitor in the thermal sensor of FIG. 3 during charging and discharging stages of the capacitor, and a waveform of a signal that controls a switch in the thermal sensor of FIG. 3, according to some embodiments described herein.

FIG. 4A shows waveforms of voltages on top plate 306 and bottom plate 305 of capacitor C1$_1$ during charging and discharging stages of capacitor C1$_1$, and a waveform of signal Q2 that controls switch S1, according to some embodiments described herein. As shown in FIG. 4A, top plate 306 of capacitor C1$_2$ can be charged in a charging stage during time interval t1 (e.g., between times 451a and 451a', between times 451c and 451c', and between times 451e and 451e'). During each charging stage, a voltage (e.g., corresponding voltage V$_{C1}$ in FIG. 3) of top plate 306 (FIG. 4) can change (e.g., increase) from a value of V1 to a value of V2. FIG. The value of V1 can correspond to the value of the voltage of top plate 306 at the beginning of the charging of capacitor C1$_1$. The value of V1 can depend on the value of voltage V$_{D1}$ across diode D1. The value of V2 can correspond to the value of the voltage of top plate 306 at the end of the charging stage of capacitor C1$_1$. The value of V2 can be at least equal to the value of voltage V$_{REF}$ (FIG. 3). As shown in FIG. 4A, at each of times 451a', 451c', and 451e' in FIG. 4A, the value of the voltage of top plate 306 can decrease to the value of V0 (e.g., in FIG. 3, when S1=OFF and S3=ON). The value of V0 can be zero (e.g., ground) or approximately 0 volts.

As shown in FIG. 4A, the voltage of bottom plate 305 of capacitor C1$_1$ can remain at a value of V0 while top plate 306 of capacitor C1$_1$ is charged from the value of V1 to the value of V2. At each of times 451a', 451c', and 451e', the value of the voltage of bottom plate 305 can decrease below zero to a negative value of $-V3$. The negative value (e.g., $-V3$) of bottom plate 305 of capacitor C1$_1$ causes diode D1 to be in forward-bias condition. The absolute value of $-V3$ (e.g., which is V3) can be equal to the absolute value of V2. Thus, if V2=V$_{REF}$, then $-V3=-V_{REF}$.

In a similar fashion, in FIG. 3, a negative voltage is generated at a bottom place 307 of capacitor and applied to the cathode of diode D2 to cause it to be in a forward-bias condition. For example, in a charging stage of capacitor C1$_2$ (while capacitor C1$_1$ is discharged), a bottom plate 307 of capacitor C1$_2$ is coupled to ground (e.g., at node 399) through transistor P2 (which is turned on) while a top plate 308 of capacitor C1$_2$ is charged (e.g., linearly charged) with current Ic. Then, top plate 308 of capacitor C1$_2$ 308 is coupled to ground (through switch S4). This causes bottom plate 307 of capacitor C1$_2$ to have a negative voltage. The negative voltage from bottom plate 307 of capacitor C1$_2$ is applied to the cathode of diode D2, causing diode 2 to be in forward-bias condition. This biases a current (e.g., I$_{D2}$ not shown in FIG. 3) to diode D2 and causes capacitor C1$_2$ to quickly discharge toward ground through diode D2 (which is in forward-bias condition). Capacitor C1$_2$ may stop discharging when the voltage at its bottom plate 307 reaches a value of a voltage (e.g., $-V_{D2}$) that causes diode D2 to be out of forward-bias condition. The description herein assumes that the serial resistance R associated with diode D2 is negligible.

Figure 4B:
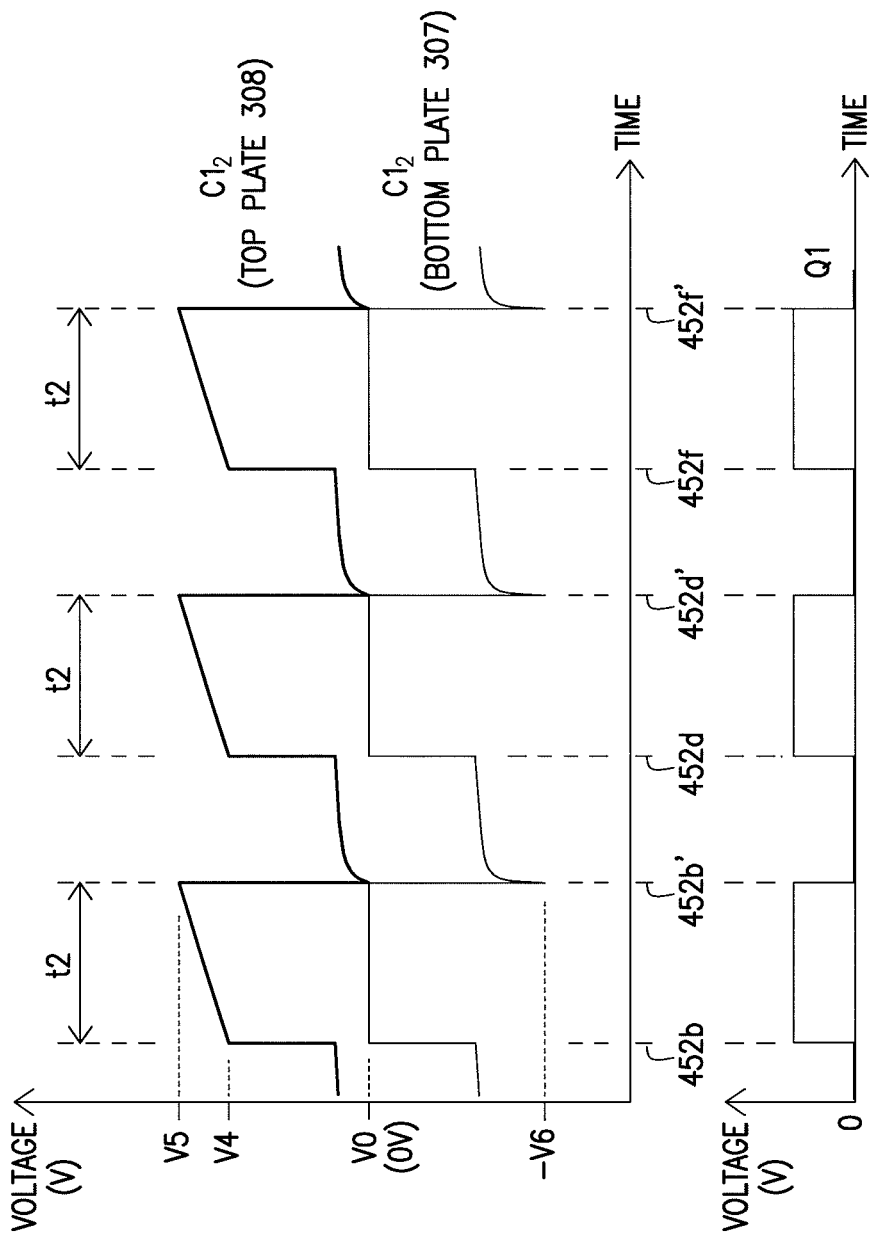
FIG. 4B shows waveforms of voltages on top and bottom plates of an additional capacitor in the thermal sensor of FIG. 3 during charging and discharging stages of the additional capacitor, and a waveform of a signal that controls another switch in the thermal sensor of FIG. 3, according to some embodiments described herein.

FIG. 4B shows waveforms of voltages on top plate 308 and bottom plate 307 of capacitor C1$_2$ during charging and discharging stages of capacitor C1$_2$, and a waveform of signal Q1 that controls switch S2, according to some embodiments described herein. The changes in values of voltages on top and bottom plates 308 and 307 of capacitor C1$_2$ can be similar but opposite to changes in the voltages of capacitor C1$_1$ of FIG. 4A. For example, as described above with reference to FIG. 3, when capacitor C1$_1$ is charged, capacitor C1$_2$ is discharged; when capacitor C1$_1$ is discharged, capacitor C1$_2$ is charged. Thus, in FIG. 4B, the interval between times 452b and 452b' can occur during the time interval between times 451a' and 451c of FIG. 4A, the interval between times 452d and 452d' of FIG. 4B can occur during the time interval between times 451c' and 451e of FIG. 4A, and the interval between times 452f and 452f' of FIG. 4B can occur after time 451e' of FIG. 4A.

As shown in FIG. 4B, top plate 308 of capacitor C1$_2$ can be charged in a charging stage during time interval t2 (e.g., between times 452b and 452b', between times 452d and 452d', and between times 452f and 452f). During each charging stage, a voltage (e.g., corresponding voltage V$_{C1}$ in FIG. 3)) of top plate 308 (FIG. 4) can change (e.g., increase) from a voltage a value of V4 to a value of V5. The value of V4 can correspond to the value of the voltage of top plate 308 at the beginning of the charging of capacitor C1$_2$. The value of V4 can depend on the value of voltage V$_{D2}$ across diode D2. The value of V5 can correspond to the value of the voltage of top plate 308 at the end of the charging stage of capacitor C1$_2$. The value of V5 can be at least equal to the value of voltage V$_{REF}$ (FIG. 3). As shown in FIG. 4B, at each of times 452b', 452d', and 452f' the value of the voltage of top plate 308 can decrease to the value of V0 (e.g., when S2=OFF and S4=ON).

The voltage of bottom plate 307 of capacitor C1$_2$ can remain at a value of V0 while top plate 308 of capacitor C1$_2$ is charged from the value of V4 to the value of V5. At each of times 452b', 452d', and 452f, the value of the voltage of bottom plate 307 of capacitor C1$_2$ can decrease below zero to a negative value of –V6. The negative value (e.g., –V6) of bottom plate 307 causes diode D2 to be in forward-bias condition. The absolute value of –V6 (e.g., which is V6) can be equal to the absolute value of V5. Thus, if V5=V$_{REF}$, then –V6=–V$_{REF}$.

As shown in FIG. 4A and FIG. 4B, a negative voltage (e.g., –V3 or –V6) can be generated by thermal sensor 303 (FIG. 303) that alternately (e.g., at times 451a', 452b', 451c', 452d', 451e', and 452f) causes diodes D1 and D2 to be in forward-bias condition. This allows thermal sensor 303 to extract temperature information based at least in part on the duty cycle of signal SEN$_{OUT}$, which is generated based on the temperature-dependent of voltages V$_{D1}$ and V$_{D2}$ of ratio-sized diodes D1 and D2.

Thus, as described above with reference to FIG. 3, FIG. 4A, and FIG. 4B, at one time (e.g., when S3=ON), a negative voltage is generated (e.g., at bottom plate 305 of capacitor C1$_1$) and is used to cause diode D1 to be in forward-bias condition, thereby causing voltage V$_{D1}$ to develop across diode D1. At another time (e.g., when S4=ON), a negative voltage is generated (e.g., at bottom plate 307 of capacitor C1$_2$) and is used to cause diode D2 to be in forward-bias condition, thereby causing voltage V$_{D2}$ to develop across diode D2. As mentioned above, the values of voltages V$_{D1}$ and V$_{D2}$ are temperature dependent. Thermal sensor 303 can generate a PWM signal (e.g., signal voltage SEN$_{OUT}$) having a duty cycle based on timing values derived from sampling of voltages V$_{D1}$ and V$_{D2}$. Then, thermal sensor 303 can calculate the value for temperature based at least in part on the duty cycle of the PWM signal.

In FIG. 3, comparator 310 can operate to sample the values of voltages V$_{D1}$ and V$_{D2}$ by comparing the value of voltage V$_{C1}$ with the value of voltage V$_{REF}$ (e.g., a reference voltage). The value of voltage V$_{C1}$ is based on the voltage (e.g., amount of charge) of top plate 306 of capacitor C1$_1$ or top plate 308 of capacitor C1$_2$, depending on which capacitor between capacitors C1$_1$ and C1$_2$ is being charged. Based on the comparison between the values of voltages V$_{REF}$ and V$_{C1}$, comparator 310 can generate a number of pulses. FIG. 3 shows an example of three pulses 311, 312, and 313 based on the alternate charging (and discharging) of capacitors C1$_1$ and C1$_2$. For example, comparator 310 may generate pulse 311 when the value of voltage V$_{C1}$ reaches the value of voltage V$_{REF}$ during charging of capacitor C1$_2$ (S2=ON, S1=OFF, and S4=OFF). Comparator 310 may generate pulse 312 when the value of voltage V$_{C1}$ reaches the value of voltage V$_{REF}$ during charging of capacitor C1$_1$ (S1=ON, S2=OFF, and S3=OFF). Comparator 310 may generate pulse 313 when the value of voltage V$_{C1}$ reaches the value of voltage V$_{REF}$ during another charging of capacitor C1$_2$ (S2=ON, S1=OFF, and S4=OFF). The timing between generation of one pulse to the next, (e.g., among pulses 311, 312, and 313) can be based on the charging time of capacitors C1$_1$ and C1$_2$. The charging time of capacitor C1$_1$ is the amount of time that capacitor C1$_1$ is charged in order to cause the value of voltage V$_{C1}$ to reach the value of voltage V$_{REF}$. The charging time of capacitor C1$_2$ is the amount of time that capacitor C1$_2$ is charged in order to cause the value of voltage V$_{C1}$ to reach the value of voltage V$_{REF}$. The charging times of capacitors C1$_1$ and C1$_2$ are based the temperature-dependent values of voltages V$_{D1}$ and V$_{D2}$, respectively, which in turn are based on current densities of diodes D1 and D2, respectively. As described above, diodes D1 and D2 have different current densities. Thus, the charging times of capacitors C1$_1$ and C1$_2$ are different.

Signal generator 320 can include a flip flop (e.g., a T flip-flop) to generate signal SEN$_{OUT}$ having a duty cycle (which includes time intervals t1 and t2) based on the timing between the pulses (e.g., 311, 312, and 313) generated by comparator 310. For example, signal generator 320 may begin generating portion 351 of signal SEN$_{OUT}$ when pulse 311 is generated and then stop generating portion 351 and start generating portion 352 of signal SEN$_{OUT}$ when pulse 312 is generated. Signal generator 320 may stop generating portion 352 when pulse 313 is generated. Since the timing of the pulses (e.g., 311, 312, and 313) generated by comparator 310 are based on the charging time of capacitors C1$_1$ and C1$_2$, time intervals t1 and t2 can have different values. Each time comparator 310 generates a pulse (e.g., one of 311, 312, and 313), it causes signal generator 320 to toggle signals Q1 and Q2, thereby switching the states of switches S1 and S2 (which are controlled by signals Q1 and Q2, respectively). This way, signal SEN$_{OUT}$ is a PWM having period P based on time intervals t1 and t2. Since the values of time intervals t1 and t2 is generated based on temperature-dependent voltages V$_{D1}$ and V$_{D2}$, period P of signal SEN$_{OUT}$ is a function of temperature. Thus, the duty cycle of signal SEN$_{OUT}$ is a function of temperature.

Temperature calculator 340 can operate to extract (e.g., calculate) the value of temperature based on signal SEN$_{OUT}$ and generate information TEMP$_{OUT}$ that indicates the value of temperature. For example, temperature calculator 340 can include a digital counter to generate digital information corresponding to the timing value of each of time intervals t1 and t2 (e.g., digital information corresponding to the timing value of portion 351 and 352 of FIG. 3). Temperature calculator 340 may also include circuitry (that can perform math operations) to calculate the value of temperature based on the digital information of time intervals t1 and t2 and other values (discussed below).

In signal SEN$_{OUT}$ in FIG. 3, the values of time intervals t1 and t2 can be expressed as follows.

$$t1 = \frac{C1_1}{Ic} \cdot (V_{REF} - V_{D1}), t2 = \frac{C1_2}{Ic} \cdot (V_{REF} - V_{D2}) \qquad (1)$$

As described above, the value of C1$_1$ can be the same as the value of C1$_2$ (e.g., C1$_1$=C1$_2$=C1). Thus, formula (1) can be rewritten as follows.

$$t1 = \frac{C1}{Ic} \cdot (V_{REF} - V_{D1}), t2 = \frac{C1}{Ic} \cdot (V_{REF} - V_{D2}) \qquad (2)$$

For a p-n junction diode, such as diode D (FIG. 2) and diodes D1 and D2, precise information about temperature T is contained in the voltage V$_D$ (e.g., diode-drop) across the diode:

$$V_D = Vg0 + tc \cdot T \qquad (3)$$

In formula (3), Vg0 is silicon bandgap voltage, which is a known value and normally remains at a relatively constant value; tc is temperature coefficient, which depends on the current density (e.g., size) of the diode.

As described above with reference to FIG. 3, diodes D1 and D2 can have different sizes. Thus, based on formula (3), the voltage across diodes D1 and D2 in FIG. 3 can be expressed as follows.

$$V_{D1}=Vg0+tc1 \cdot T, V_{D2}=Vg0+tc2 \cdot T \quad (4)$$

In formula (4), tc1 is the temperature coefficient of diode D1, which depends on the current density (e.g., size) of diode D1; tc2 is the temperature coefficient of diode D2, which depends on the current density (e.g., size) of diode D2.

Temperature extraction (in order to calculate temperature value) can be evaluated based at least in part on the duty cycle (dc) of signal $SEN_{OUT}$ (e.g., a ratio of time intervals t1 and t2). This way, the dependency on frequency and circuit parameters (e.g., Ic and $C1_1$ and $C1_2$) in formula (2) can be eliminated. Thus, calculation for the value of temperature is simplified. A number of combinations to calculate the value of temperature are possible, which modify dynamic range and sensitivity of the sensor. An example temperature extraction is described below (based on formulas (2) and (4) above).

$$\frac{1}{dc1-dc2}= \quad (5)$$
$$\frac{t1+t2}{t1-t2}=\frac{V_{REF}-V_{D1}-V_{D2}}{\Delta V_D}=\frac{2 \cdot V_{REF}-2 \cdot Vg0-(tc1+tc2) \cdot T}{\frac{k}{e} \cdot T \cdot \ln(N)}$$

In formula (5), k is the Boltzmann's constant; N is the ratio of diodes D1 and D2; and T is temperature (in Kevin).

Based on formula (5), temperature calculator 340 can calculate the value of temperature T.

In thermal sensor 303 described above with reference to FIG. 3, in order to achieve sensor accuracy with single-trim, voltage $V_{REF}$ can be selected to have a defined value and temperature behavior.

As shown in FIG. 3, transistors P1 and P2 are PMOS transistors that operate (e.g., as ground switches) to couple bottom plates 305 and 307 of capacitors $C1_1$ and $C1_2$, respectively, to ground during charging stages of capacitors $C1_1$ and $C1_2$. Using PMOS transistors may avoid the opening (forward-bias) of drain-bulk junctions that may occur if NMOS transistors are used for transistors P1 and P2. This may improve the operations of thermal sensor 303. Further, since transistors P1 and P2 are PMOS transistors, a negative voltage can be used to control the gates of transistors P1 and P2. In thermal sensors 303, since a negative voltage is available at the bottom plates 305 and 307 of $C1_1$ and $C1_2$, respectively (e.g., during discharging stages of capacitors $C1_1$ and $C1_2$, respectively), the negative voltage can be used to control the gates of transistors P1 and P2 by cross-coupling the gates of transistors P1 and P2 as shown in FIG. 3. This may avoid using an additional voltage source (e.g., external from thermal sensor 303) to control the gates of transistors P1 and P2. Moreover, in order to improve control of the gates of transistors P1 and P2 during at least part of the charging stage of each of capacitors $C1_1$ and $C1_2$, additional capacitors, such as capacitors $C2_1$ and $C2_2$, may be used to hold a charge that provides control at the gate of transistors P1 and P2.

As described above, the arrangement of thermal sensor 303 allows it to be single-time or no trim thermal sensor. This may improve operations of thermal sensor 303 over some conventional thermal sensors that have multiple trims. The inclusion of comparator 310 and signal generator 320 may allow thermal sensor 303 to have a simplified analog-to-digital converter (ADC) to provide a PWM signal (e.g., signal $SEN_{OUT}$) that contains temperature information. In comparison with some conventional thermal sensors, the arrangement of thermal sensor 303 may also allow it to consume relatively lower power and use a relatively low supply voltage, and have an improved thermal sensing accuracy. Further, in comparison with some conventional thermal sensors that have three terminal PNP elements, diodes D1 and D2 (which are two-terminal elements) of thermal sensor 303 may allow it to have a relatively more simplified structure, less susceptibility to incurring errors in sensing parameters, or both. Moreover, as mentioned above, since thermal sensor 303 can include the structure of thermal sensor 103, thermal sensor 303 can also include other improvements over some conventional thermal sensors, as described above with reference to FIG. 1 and FIG. 2.

Figure 5:
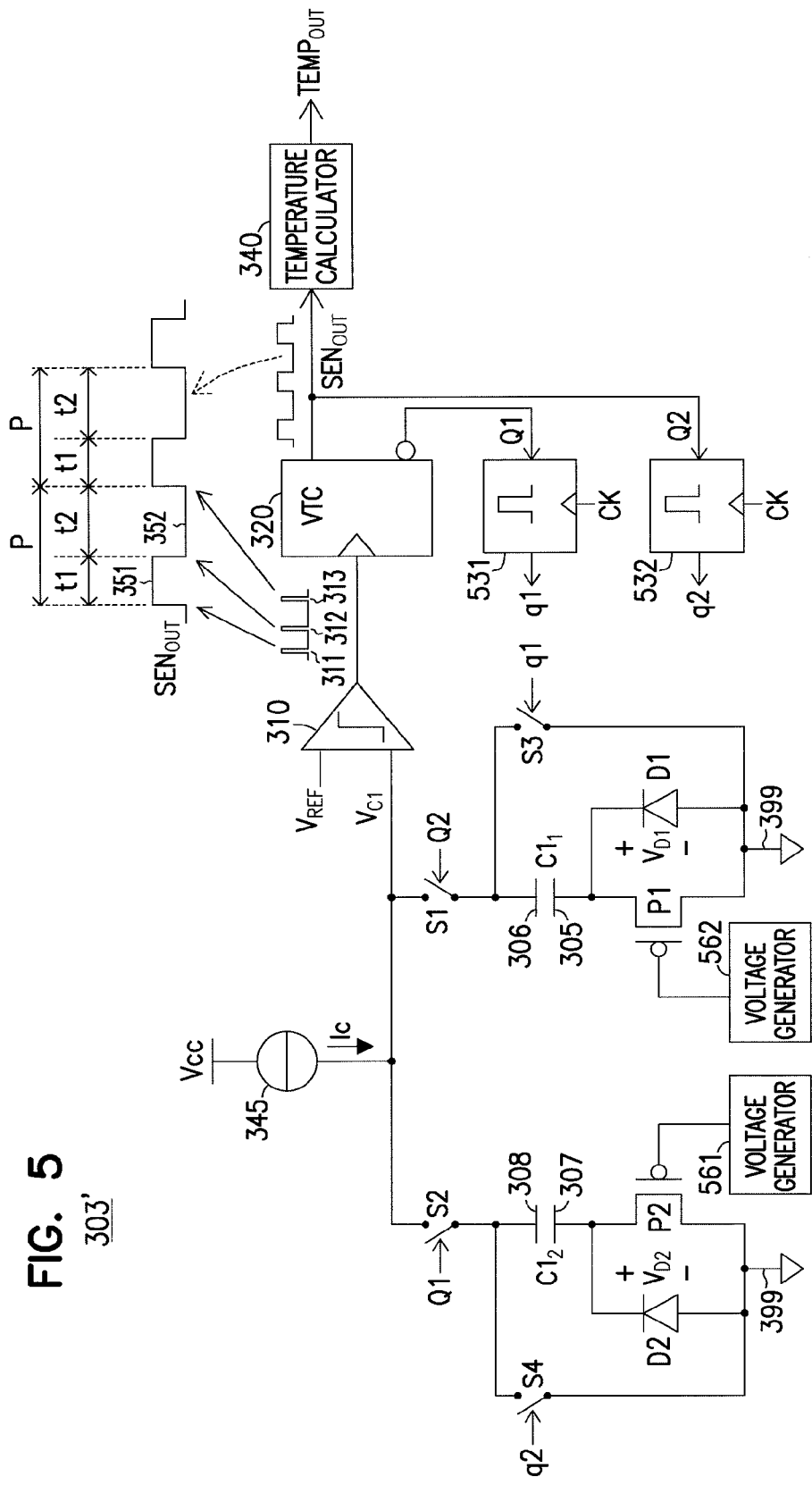
FIG. 5 shows a schematic diagram of another thermal sensor that can be a variation of the thermal sensor of FIG. 3, according to some embodiments described herein.

FIG. 5 shows a schematic diagram of a thermal sensor 303' that can be a variation of thermal sensor 303 of FIG. 3, according to some embodiments described herein. As shown in FIG. 5, thermal sensor 303' can include similar components as thermal sensor 303 of FIG. 3. Thus, for simplicity, description of similar or identical components is not repeated.

As shown in FIG. 5, switches S3 and S4 can be controlled by signals q1 and q2, respectively. Signal q1 can be generated by pulse generator 531 based on signal Q1 and timing of a signal (e.g., clock signal) CK. Pulse generator 531 can include a mono-shot pulse generator that can define the sampling time of signal q1, such that signal q1 can be based on signal Q1 but signal q1 can have a shorter active interval (e.g., shorter pulse width) than signal Q1. Controlling switch S3 with signal q1 (instead of signal Q1) may avoid impact of a potential leakage current on sampled voltage $V_{D1}$ (e.g., may prevent excessive discharge of capacitor $C1_1$ through diode D1). This may improve accuracy in sampling of voltage $V_{D1}$, thereby improving the overall accuracy of temperature sensor 303. Further, signal q1 can be generated such that it is non-overlapping with signal Q2. This prevents switches S1 and S3 from having the same state (e.g., prevents both switches S1 and S3 from being ON at the same time or from being OFF at the same time) in order to prevent errors in transitions between charging and discharging stages of capacitor $C1_1$.

Signal q2 can be generated by pulse generator 532 based on signal Q2 and timing of signal CK. Pulse generator 532 can include a mono-shot pulse generator that can define the sampling time of signal q2, such that signal q2 can be based on signal Q2 but signal q2 can have a shorter active interval (e.g., shorter pulse width) than signal Q2. Controlling switch S4 with signal q2 (instead of signal Q2) may prevent impact of a potential leakage current on sampled voltage $V_{D2}$ (e.g., may prevent excessive discharge of capacitor $C2_2$ through diode D2). This may improve accuracy in sampling of voltage $V_{D2}$, thereby improving the overall accuracy of temperature sensor 303. Further, signal q2 can be generated such that it is non-overlapping with signal Q1. This prevents switches S2 and S4 from having the same state (e.g., prevents both switches S2 and S4 from being ON at the same time or from being OFF at the same time) in order to prevent errors in transitions between charging and discharging stages of capacitor $C1_2$.

As shown in FIG. 5, thermal sensor 303' can also include voltage generators (e.g., charge pumps) 561 and 562 to provide voltage (e.g., negative voltage) to the gates of transistors P1 and P2 in order to control (e.g., turn on and turn off) transistors P1 and P2. For example, each of voltage generators 561 and 562 can include a charge pump (e.g., having a capacitor charged by a negative voltage (e.g., −Vdd) that can generate a negative voltage to control the gates of transistors P1 and P2. Using separate voltage generators 561 and 562 (instead of cross-coupling the gates of transistors P1 and P2 as in FIG. 3) may avoid impact of reduced gate-drive of transistor P2 when capacitor $C1_1$ is discharged through diode D1 and avoid the impact of reduced gate-drive of transistor P1 when capacitor $C1_2$ is discharged through diode D2. Similar to thermal sensor 303 (FIG. 3), thermal sensor 303' in FIG. 5 can have improvements over some conventional thermal sensors, as described above with reference to FIG. 3 through FIG. 4B.

FIG. 5 shows an example where diodes D1 and D2 have different sizes. Alternatively, diodes D1 and D2 may have the same size but different currents may be used to forward-bias diodes D1 and D2. For example, signals q1 and q2 can be generated with different pulse widths, so that the amount of time that diode D1 is in the forward-bias condition is different from the amount of time that diode D2 is in the forward-bias condition. Different amount of times for diodes D1 and D2 to be in the forward-bias condition results in different current densities being used to cause diodes D1 and D2 to be in the forward-bias condition. As an example, the pulse width of signal q2 may be generated to be X (where X is greater than one) times the pulse width of signal q1. This may cause the current density of diode D2, at the time of sampling voltage $V_{D2}$ at diode D2, to be less than the current density of diode D1, at the time of sampling voltage $V_{D1}$.

As described above with reference to FIG. 3, in order to achieve sensor accuracy with single-trim, voltage $V_{REF}$ can be selected to have a defined value and temperature behavior. However, in some arrangements of thermal sensor 303 (FIG. 3) or 303' (FIG. 5), if exact known value and temperature behaviour of Vdd is unavailable, then the value of voltage $V_{REF}$ may be selected as follows. For example, the value of voltage $V_{REF}$ may be selected to be at an arbitrary value that is greater than the value (e.g., expected value) of each of voltages $V_{D1}$ and $V_{D2}$. Then, a measurement may be performed to measure the time (e.g., t0), which is needed to charge capacitor $C1_1$ or $C1_2$ from 0.0V to the selected arbitrary value of voltage $V_{REF}$. This could be one of the initial pulses, created when thermal sensor 303 (FIG. 3) or 303' (FIG. 5) is switched on (e.g., enabled). This way, the value of voltage $V_{REF}$ becomes referenced to current Ic and C1, like the other values of voltages in formula (2) described above. With this new parameter (which is a function of voltage $V_{REF}$), a modified formula—different from formula (5) described above—can be chosen, which includes also "t0" and make the temperature calculation independent from the value of voltage $V_{REF}$.

The illustrations of apparatus (e.g., apparatus 100 including thermal sensor 103, 303, and 303') and methods (e.g., the operations of thermal sensor 103, 303, and 303') described above with reference to FIG. 1 through FIG. 5) are intended to provide a general understanding of the structure of various embodiments and are not intended to provide a complete description of all the elements and features of apparatuses that might make use of the structures described herein.

The apparatus (e.g., apparatus 100 including thermal sensor 103, 303, and 303') described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

ADDITIONAL NOTES AND EXAMPLES

Example 1 includes subject matter (such as a device, an electronic apparatus (e.g., circuit, electronic system, or both), or a machine) including a node to receive ground potential, a first diode including an anode coupled to the node, a second diode including an anode coupled to the node, a first circuit to apply a voltage to a cathode of each of the first and second diodes to cause the first and second diodes to be in a forward-bias condition, and a second circuit to generate a signal having a duty cycle based on a first voltage across the first diode and a second voltage across the second diode.

In Example 2, the subject matter of Example 1 may optionally include, further comprising a temperature calculator to calculate a value of temperature based at least in part on the duty cycle of the signal.

In Example 3, the subject matter of Example 1 or 2 may optionally include, wherein the first and second diodes are arranged to be biased with different current densities.

In Example 4, the subject matter of Example 1 or 2 may optionally include, wherein the first circuit is arranged to cause the first and second diodes to be in the forward-bias condition at different times.

In Example 5, the subject matter of Example 1 or 2 may optionally include, wherein the first circuit includes a capacitor and the circuit is arranged to charge a first plate of the capacitor when a second plate of the capacitor is coupled to the node, and decouple the second plate from the node and couple the first plate to the node to generate the voltage applied to the cathode of one of the first and second diodes.

In Example 6, the subject matter of Example 5 may optionally include, wherein the capacitor is charged for an amount of time until the first plate reaches a reference voltage, and the duty cycle of the signal is based on the amount of time.

In Example 7, the subject matter of Example 1 or 2 may optionally include, wherein the first circuit includes a first capacitor coupled to the first diode, a second capacitor coupled to the second diode, a first p-channel transistor coupled between the first capacitor and the node, and a second p-channel transistor coupled between the second capacitor and the node.

In Example 8, the subject matter of Example 7 may optionally include, wherein a gate of the first p-channel transistor is coupled to the cathode of the second diode, and a gate of the second p-channel transistor is coupled to the cathode of the first diode.

In Example 9, the subject matter of Example 8 may optionally include, wherein the first circuit includes a first additional capacitor coupled to the gate of the first p-channel transistor, and a second additional capacitor coupled to the gate of the second p-channel transistor.

Example 10 includes subject matter (such as a device, an electronic apparatus (e.g., circuit, electronic system, or both), or a machine) including a first material, a first diode and a second diode, each of the first and second diodes including a p-n junction formed from a portion of the first material and a portion of a second material, a first circuit to generate a negative voltage and apply the negative voltage to the first and second diodes to alternately cause the first and second diodes to be in a forward-bias condition, and a second circuit to generate a signal having a duty cycle based on a first voltage across the first diode and a second voltage across the second diode.

In Example 11, the subject matter of Example 10 may optionally include, wherein the first material is included in a substrate, and the second material is part of an n-well formed in the substrate.

In Example 12, the subject matter of Example 10 may optionally include, wherein the first and second diodes have a size ratio different from one.

In Example 13, the subject matter of any of Examples 10-12 may optionally include, wherein the first circuit includes a charge pump to generate the negative voltage.

In Example 14, the subject matter of any of Examples 10-12 may optionally include, wherein the first circuit includes a first capacitor coupled to the first diode and a second capacitor coupled to the second diode, and the first circuit is arranged to alternately charge a first plate of the first capacitor and a first plate of the second capacitor, and alternately couple the first plate of the first capacitor and the first plate of the second capacitor to ground to alternately generate the negative voltage at a second plate of the first capacitor and a second plate of the second capacitor.

In Example 15, the subject matter of Example 14 may optionally include, wherein the second circuit includes a comparator to compare a reference voltage with a voltage from the first plate of each of the first and second capacitor to generate pulses, such that the duty cycle of the signal is based on timing between the pulses.

In Example 16, the subject matter of Example 14 may optionally include, further comprising a current source to provide a current to charge the first plate of each of the first and second capacitors.

In Example 17, the subject matter of any of Examples 10-12 may optionally include, further comprising a temperature calculator to calculate a value of temperature based at least in part on the duty cycle of the signal.

Example 18 includes subject matter such as a device, an electronic apparatus (e.g., circuit, electronic system, or both), or a machine) including a substrate including a p-type material, a multi-gate transistor structure formed over the substrate, a first diode and a second diode, each of the first and second diodes including a p-n junction formed a portion of the substrate and a portion of an n-type material formed over the substrate, a first circuit to apply a negative voltage to the first and second diodes to alternately cause the first and second diodes to be in a forward-bias condition, and a second circuit to generate a signal having a duty cycle based on a first voltage across the first diode and a second voltage across the second diode.

In Example 19, the subject matter of Example 18 may optionally include, wherein the multi-gate transistor structure includes tri-gate transistors.

In Example 20, the subject matter of Example 18 may optionally include, wherein the multi-gate transistor structure includes finFET transistors.

In Example 21, the subject matter of any of Examples 18-20 may optionally include, further comprising a temperature calculator to calculate a value of temperature based at least in part on the duty cycle of the signal.

Example 22 includes subject matter (such as a method of operating a device, an electronic apparatus (e.g., circuit, electronic system, or both), or a machine) including generating a negative voltage, applying the negative voltage to each of a first diode and a second diode to cause each of the first and second diodes to be in a forward-bias condition, sampling a first voltage across the first diode and a second voltage across the second diode, converting values of the first and second voltages into timing values based on sampling of the first and second voltages, and generating a pulse-width modulation signal having a duty cycle based on the timing values.

In Example 23, the subject matter of Example 22 may optionally include, further comprising calculating a value of temperature based at least in part on the duty cycle of the signal.

In Example 24, the subject matter of Example 22 or 23 may optionally include, wherein generating the negative voltage includes charging a first plate of a capacitor while a second plate of the capacitor is coupled to ground, and decoupling the second plate from ground and coupling the first plate to ground to generate the negative voltage at the second plate.

In Example 25, the subject matter of Example 22 or 23 may optionally include, wherein generating the negative voltage includes alternately charging a first plate of a first capacitor and a first plate of a second capacitor, and alternately coupling the first plate of the first capacitor and the first plate of the second capacitor to ground to alternately generating the negative voltage at a second plate of the first capacitor and a second plate of the second capacitor.

In Example 26, the subject matter of Example 25 may optionally include, wherein the first plate of each of the first and second capacitors is charged with a same current source.

Example 27 includes subject matter (such as a device, an electronic apparatus (e.g., circuit, electronic system, or both), or machine) including means for performing any of the methods of examples 22-26.

The subject matter of Example 1 through Example 27 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

The invention claimed is:

1. An apparatus comprising:
a node to receive ground potential;
a first diode including an anode coupled to the node;
a second diode including an anode coupled to the node;
a first circuit to apply a voltage to a cathode of each of the first and second diodes to cause the first and second diodes to be in a forward-bias condition, the first circuit including a capacitor coupled to the cathode of the first diode; and
a second circuit to generate a signal having a duty cycle based on a first voltage across the first diode and a second voltage across the second diode.

2. The apparatus of claim 1, further comprising a temperature calculator to calculate a value of temperature based at least in part on the duty cycle of the signal.

3. The apparatus of claim 1, wherein the first and second diodes are arranged to be biased with different current densities.

4. The apparatus of claim 1, wherein the first circuit is arranged to cause the first and second diodes to be in the forward-bias condition at different times.

5. An apparatus comprising:
a node to receive ground potential;
a first diode including an anode coupled to the node;
a second diode including an anode coupled to the node:
a first circuit to apply a voltage to a cathode of each of the first and second diodes to cause the first and second diodes to be in a forward-bias condition; and
a second circuit to generate a signal having a duty cycle based on a first voltage across the first diode and a second voltage across the second diode, wherein the first circuit includes a capacitor and the circuit is arranged to:
charge a first plate of the capacitor when a second plate of the capacitor is coupled to the node; and
decouple the second plate from the node and couple the first plate to the node to generate the voltage applied to the cathode of one of the first and second diodes.

6. The apparatus of claim 5, wherein the capacitor is charged for an amount of time until the first plate reaches a reference voltage, and the duty cycle of the signal is based on the amount of time.

7. An apparatus comprising:
a node to receive ground potential;
a first diode including an anode coupled to the node;
a second diode including an anode coupled to the node;
a first circuit to apply a voltage to a cathode of each of the first and second diodes to cause the first and second diodes to be in a forward-bias condition; and
a second circuit to generate a signal having a duty cycle based on a first voltage across the first diode and a second voltage across the second diode, wherein the first circuit includes:
a first capacitor coupled to the first diode;
a second capacitor coupled to the second diode;
a first p-channel transistor coupled between the first capacitor and the node; and
a second p-channel transistor coupled between the second capacitor and the node.

8. The apparatus of claim 7, wherein a gate of the first p-channel transistor is coupled to the cathode of the second diode, and a gate of the second p-channel transistor is coupled to the cathode of the first diode.

9. The apparatus of claim 8, wherein the first circuit includes a first additional capacitor coupled to the gate of the first p-channel transistor, and a second additional capacitor coupled to the gate of the second p-channel transistor.

10. An apparatus comprising:
a first material;
a first diode and a second diode, each of the first and second diodes including a p-n junction formed from a portion of the first material and a portion of a second material;
a first circuit to generate a negative voltage and apply the negative voltage to the first and second diodes to alternately cause the first and second diodes to be in a forward-bias condition, the first circuit including a capacitor coupled to a cathode of the first diode; and
a second circuit to generate a signal having a duty cycle based on a first voltage across the first diode and a second voltage across the second diode.

11. The apparatus of claim 10, wherein the first material is included in a substrate, and the second material is part of an n-well formed in the substrate.

12. The apparatus of claim 10, wherein the first and second diodes have a size ratio different from one.

13. The apparatus of claim 10, wherein the first circuit includes a charge pump to generate the negative voltage.

14. The apparatus of claim 10, further comprising a temperature calculator to calculate a value of temperature based at least in part on the duty cycle of the signal.

15. An apparatus comprising:
a first material;
a first diode and a second diode, each of the first and second diodes including a junction formed from a portion of the first material and a portion of a second material;
a first circuit to generate a negative voltage and apply the negative voltage to the first and second diodes to alternately cause the first and second diodes to be in a forward-bias condition; and
a second circuit to generate a sinal having a duty cycle based on a first voltage across the first diode and a second voltage across the second diode, wherein the first circuit includes a first capacitor coupled to the first diode and a second capacitor coupled to the second diode, and the first circuit is arranged to:
alternately charge a first plate of the first capacitor and a first plate of the second capacitor; and
alternately couple the first plate of the first capacitor and the first plate of the second capacitor to ground to alternately generate the negative voltage at a second plate of the first capacitor and a second plate of the second capacitor.

16. The apparatus of claim 15, wherein the second circuit includes a comparator to compare a reference voltage with a voltage from the first plate of each of the first and second capacitors to generate pulses, such that the duty cycle of the signal is based on timing between the pulses.

17. The apparatus of claim 15, further comprising a current source to provide a current to charge the first plate of each of the first and second capacitors.

18. An apparatus comprising:
a substrate including a p-type material;
a multi-gate transistor structure formed over the substrate;
a first diode and a second diode, each of the first and second diodes including a p-n junction formed a portion of the substrate and a portion of an n-type material formed over the substrate;
a first circuit to apply a negative voltage to the first and second diodes to alternately cause the first and second diodes to be in a forward-bias condition, the first circuit including a capacitor coupled to a cathode of the first diode; and a second circuit to generate a signal having a duty cycle based on a first voltage across the first diode and a second voltage across the second diode.

19. The apparatus of claim 18, wherein the multi-gate transistor structure includes tri-gate transistors.

20. The apparatus of claim 18, wherein the multi-gate transistor structure includes finFET transistors.

21. The apparatus of claim 18, further comprising a temperature calculator to calculate a value of temperature based at least in part on the duty cycle of the signal.

\* \* \* \* \*